on | (12) | United States Patent<br>Wegmann et al. | (10) Patent No.: US 8,120,763 B2<br>(45) Date of Patent: *Feb. 21, 2012 |

(54) DEVICE AND METHOD FOR THE OPTICAL MEASUREMENT OF AN OPTICAL SYSTEM BY USING AN IMMERSION FLUID

(75) Inventors: Ulrich Wegmann, Koenigsbronn (DE); Uwe Schellhorn, Aalen (DE); Joachim Stuehler, Aalen (DE); Albrecht Ehrmann, Koenigsbronn (DE); Martin Schriever, Aalen (DE); Markus Goeppert, Aalen (DE); Helmut Haidner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/489,639

(22) Filed: Jun. 23, 2009

(65) Prior Publication Data

US 2009/0257049 A1 Oct. 15, 2009

Related U.S. Application Data

(63) Continuation of application No. 12/147,034, filed on Jun. 26, 2008, now abandoned, which is a continuation of application No. 11/080,525, filed on Mar. 16, 2005, now Pat. No. 7,408,652, which is a continuation-in-part of application No. PCT/EP03/14663, filed on Dec. 19, 2003.

(30) Foreign Application Priority Data

Dec. 20, 2002 (DE) .................................. 102 61 775

(51) Int. Cl.
*G01B 9/00* (2006.01)
*G01B 9/02* (2006.01)
*G03B 27/42* (2006.01)
(52) U.S. Cl. ............................ 356/124; 355/53; 356/521
(58) Field of Classification Search .................. 356/124, 356/489, 495, 515, 521; 355/53
See application file for complete search history.

(56) References Cited

U.S. PATENT DOCUMENTS 4,346,164 A 8/1982 Tabarelli et al.
(Continued)

FOREIGN PATENT DOCUMENTS

DE 221 563 A1 4/1985
(Continued)

OTHER PUBLICATIONS

Apr. 12, 2010 Office Action issued in U.S. Appl. No. 11/896,447.
(Continued)

*Primary Examiner* — Patrick J Connolly
(74) *Attorney, Agent, or Firm* — Fish & Richardson P.C.

(57) ABSTRACT

A device for the optical measurement of an optical system, in particular an optical imaging system, is provided. The device includes at least one test optics component arranged on an object side or an image side of the optical system. An immersion fluid is adjacent to at least one of the test optics components. A container for use in this device, a microlithography projection exposure machine equipped with this device, and a method which can be carried out with the aid of this device are also provided. The device and method provide for optical measurement of microlithography projection objectives with high numerical apertures by using wavefront detection with shearing or point diffraction interferometry, or a Moiré measuring technique.

14 Claims, 8 Drawing Sheets

U.S. PATENT DOCUMENTS

| | | | |
|---|---|---|---|
| 4,418,984 A | 12/1983 | Wysocki et al. | |
| 4,465,368 A | 8/1984 | Matsuura et al. | |
| 4,480,910 A * | 11/1984 | Takanashi et al. | 355/30 |
| 4,562,671 A | 1/1986 | Bouillon et al. | |
| 4,965,630 A | 10/1990 | Kato et al. | |
| 5,331,369 A | 7/1994 | Terasawa et al. | |
| 5,384,573 A | 1/1995 | Turpin | |
| 5,448,332 A | 9/1995 | Sakakibara et al. | |
| 5,452,583 A | 9/1995 | Schulte | |
| 5,493,403 A | 2/1996 | Nishi | |
| 5,528,118 A | 6/1996 | Lee | |
| 5,610,683 A | 3/1997 | Takahashi | |
| 5,623,853 A | 4/1997 | Novak et al. | |
| 5,646,413 A | 7/1997 | Nishi | |
| 5,677,525 A | 10/1997 | Volcker et al. | |
| 5,715,039 A | 2/1998 | Fukuda et al. | |
| 5,798,838 A * | 8/1998 | Taniguchi et al. | 356/401 |
| 5,825,043 A * | 10/1998 | Suwa | 250/548 |
| 5,867,319 A | 2/1999 | Sugiyama et al. | |
| 5,874,820 A | 2/1999 | Lee | |
| 5,883,704 A | 3/1999 | Nishi et al. | |
| 5,900,354 A * | 5/1999 | Batchelder | 430/395 |
| 5,925,887 A | 7/1999 | Sakai et al. | |
| 5,969,441 A | 10/1999 | Loopstra et al. | |
| 6,002,467 A | 12/1999 | Nishi et al. | |
| 6,013,401 A | 1/2000 | McCullough et al. | |
| 6,208,407 B1 | 3/2001 | Loopstra | |
| 6,239,909 B1 | 5/2001 | Hayashi et al. | |
| 6,281,967 B1 | 8/2001 | Kudo | |
| 6,292,255 B1 | 9/2001 | McCullough | |
| 6,292,608 B1 | 9/2001 | Toh | |
| 6,312,373 B1 | 11/2001 | Ichihara | |
| 6,337,162 B1 | 1/2002 | Irie | |
| 6,341,007 B1 | 1/2002 | Nishi et al. | |
| 6,400,441 B1 | 6/2002 | Nishi et al. | |
| 6,448,568 B1 | 9/2002 | Allen et al. | |
| 6,549,269 B1 | 4/2003 | Nishi et al. | |
| 6,563,565 B2 | 5/2003 | Nishi | |
| 6,563,567 B1 | 5/2003 | Komatsuda et al. | |
| 6,590,634 B1 | 7/2003 | Nishi et al. | |
| 6,627,365 B1 | 9/2003 | Shiraishi | |
| 6,650,399 B2 | 11/2003 | Baselmans et al. | |
| 6,730,925 B1 | 5/2004 | Ozawa | |
| 6,771,350 B2 | 8/2004 | Nishinaga | |
| 6,785,006 B2 | 8/2004 | Nishida | |
| 6,788,477 B2 | 9/2004 | Lin | |
| 6,940,582 B1 | 9/2005 | Tanaka | |
| 6,961,115 B2 | 11/2005 | Harnatani et al. | |
| 7,130,037 B1 | 10/2006 | Lange | |
| 7,213,963 B2 | 5/2007 | Lof et al. | |
| 7,221,431 B2 | 5/2007 | Ohsaki | |
| 7,227,616 B2 | 6/2007 | Graeupner | |
| 7,301,607 B2 | 11/2007 | Hazelton et al. | |
| 7,408,652 B2 * | 8/2008 | Wegmann et al. | 356/515 |
| 7,486,380 B2 | 2/2009 | Hazelton et al. | |
| 7,623,218 B2 * | 11/2009 | Wegmann et al. | 355/30 |
| 7,760,366 B2 * | 7/2010 | Mengel et al. | 356/515 |
| 7,796,274 B2 * | 9/2010 | Mengel et al. | 356/515 |
| 2001/0041297 A1 | 11/2001 | Nishi | |
| 2001/0043320 A1 * | 11/2001 | Kato et al. | 355/67 |
| 2002/0001088 A1 * | 1/2002 | Wegmann et al. | 356/521 |
| 2002/0033934 A1 * | 3/2002 | Ishii | 355/30 |
| 2002/0041377 A1 | 4/2002 | Hagiwara et al. | |
| 2002/0061469 A1 | 5/2002 | Tanaka | |
| 2002/0101574 A1 | 8/2002 | Tsuji | |
| 2002/0118370 A1 | 8/2002 | Nishida | |
| 2002/0145717 A1 * | 10/2002 | Baselmans et al. | 355/53 |
| 2002/0159040 A1 | 10/2002 | Harnatani et al. | |
| 2002/0163629 A1 | 11/2002 | Switkes et al. | |
| 2002/0167642 A1 | 11/2002 | Jones et al. | |
| 2002/0187406 A1 | 12/2002 | Magome et al. | |
| 2003/0025890 A1 | 2/2003 | Nishinaga | |
| 2003/0030916 A1 | 2/2003 | Suenaga | |
| 2003/0174408 A1 * | 9/2003 | Rostalski et al. | 359/642 |
| 2003/0224295 A1 | 12/2003 | Heerens et al. | |
| 2004/0000627 A1 | 1/2004 | Schuster | |
| 2004/0075895 A1 | 4/2004 | Lin | |
| 2004/0090606 A1 | 5/2004 | Ishikawa | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/1022452 | 11/2004 | Endo et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0002004 A1 | 1/2005 | Kolesnychenko et al. | |
| 2005/0007569 A1 | 1/2005 | Streefkerk et al. | |
| 2005/0007570 A1 | 1/2005 | Streefkerk et al. | |
| 2005/0018155 A1 | 1/2005 | Cox et al. | |
| 2005/0018156 A1 | 1/2005 | Mulkens et al. | |
| 2005/0024609 A1 | 2/2005 | De Smit et al. | |
| 2005/0030497 A1 | 2/2005 | Nakamura | |
| 2005/0030498 A1 | 2/2005 | Mulkens | |
| 2005/0030506 A1 | 2/2005 | Schuster | |
| 2005/0030511 A1 | 2/2005 | Auer-Jongepier et al. | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048220 A1 | 3/2005 | Mertens et al. | |
| 2005/0048223 A1 | 3/2005 | Pawloski et al. | |
| 2005/0052632 A1 | 3/2005 | Miyajima | |
| 2005/0068639 A1 | 3/2005 | Pierrat et al. | |
| 2005/0073670 A1 | 4/2005 | Carroll | |
| 2005/0078286 A1 | 4/2005 | Dierichs et al. | |
| 2005/0078287 A1 | 4/2005 | Sengers et al. | |
| 2005/0084794 A1 | 4/2005 | Meagley et al. | |
| 2005/0088635 A1 | 4/2005 | Hoogendam et al. | |
| 2005/0094114 A1 | 5/2005 | Streefkerk et al. | |
| 2005/0094116 A1 | 5/2005 | Flagello et al. | |
| 2005/0094119 A1 | 5/2005 | Loopstra et al. | |
| 2005/0099635 A1 | 5/2005 | Kakuchu et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146693 A1 | 7/2005 | Ohsaki | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |

| | | | | | | |
|---|---|---|---|---|---|---|
| 2005/0190455 A1 | 9/2005 | Rostalski et al. | | JP | A-11-16816 | 1/1999 |
| 2005/0205108 A1 | 9/2005 | Chang et al. | | JP | A-11-135400 | 5/1999 |
| 2005/0213061 A1 | 9/2005 | Hakey et al. | | JP | A-11-176727 | 7/1999 |
| 2005/0213072 A1 | 9/2005 | Schenker et al. | | JP | A-11-194479 | 7/1999 |
| 2005/0217135 A1 | 10/2005 | O'Donnell et al. | | JP | A-11-238680 | 8/1999 |
| 2005/0217137 A1 | 10/2005 | Smith et al. | | JP | 11-297615 | 10/1999 |
| 2005/0217703 A1 | 10/2005 | O'Donnell | | JP | A-2000-12453 | 1/2000 |
| 2005/0219481 A1 | 10/2005 | Cox et al. | | JP | A-2000-29202 | 1/2000 |
| 2005/0219482 A1 | 10/2005 | Baselmans et al. | | JP | 120 58 436 | 2/2000 |
| 2005/0219499 A1 | 10/2005 | Zaal et al. | | JP | A-2000-58436 | 2/2000 |
| 2005/0225737 A1 | 10/2005 | Weissenrieder et al. | | JP | A-2000-097616 | 4/2000 |
| 2005/0231694 A1 | 10/2005 | Kolesnychenko et al. | | JP | 2000-505958 | 5/2000 |
| 2005/0233081 A1 | 10/2005 | Tokita | | JP | A-2000-315648 | 11/2000 |
| 2005/0237501 A1 | 10/2005 | Furukawa et al. | | JP | A-2001-144004 | 5/2001 |
| 2005/0243292 A1 | 11/2005 | Baselmans et al. | | JP | 2002-022606 | 1/2002 |
| 2005/0243328 A1* | 11/2005 | Wegmann et al. ............ 356/520 | | JP | A-2002-14005 | 1/2002 |
| 2005/0245005 A1 | 11/2005 | Benson | | JP | 2002-071513 | 3/2002 |
| 2005/0253090 A1 | 11/2005 | Gau et al. | | JP | A-2002-071513 | 3/2002 |
| 2005/0259232 A1 | 11/2005 | Streefkerk et al. | | JP | A-2002-071514 | 3/2002 |
| 2005/0259233 A1 | 11/2005 | Streefkerk et al. | | JP | 2002-100561 | 4/2002 |
| 2005/0259236 A1 | 11/2005 | Straaijer | | JP | A-2002-250678 | 9/2002 |
| 2005/0264778 A1 | 12/2005 | Lof et al. | | JP | A-2002-296005 | 10/2002 |
| 2005/0270505 A1 | 12/2005 | Smith | | JP | A-2004-301825 | 10/2004 |
| 2006/0007418 A1 | 1/2006 | Hamatani et al. | | JP | 2005-79587 | 3/2005 |
| 2006/0103832 A1 | 5/2006 | Hazelton et al. | | JP | A-2005-92948 | 4/2005 |
| 2006/0170891 A1 | 8/2006 | Nishinaga et al. | | JP | 2007-527611 | 9/2007 |
| 2006/0176457 A1 | 8/2006 | Ishii et al. | | KR | 1998-032589 | 7/1998 |
| 2006/0192093 A1 | 8/2006 | Kok et al. | | KR | 2001-0034274 | 4/2001 |
| 2006/0274297 A1 | 12/2006 | Ogusu | | SU | 890067 | 12/1981 |
| 2006/0285100 A1 | 12/2006 | Hamatani et al. | | SU | 977942 A | 11/1982 |
| 2007/0132971 A1 | 6/2007 | Sengers et al. | | WO | WO 98/24115 | 6/1998 |
| 2007/0132979 A1 | 6/2007 | Lof et al. | | WO | WO 98/28665 | 7/1998 |
| 2008/0144043 A1 | 6/2008 | Wegmann et al. | | WO | WO 99/00689 | 1/1999 |
| 2008/0180688 A1* | 7/2008 | Mengel et al. ................ 356/515 | | WO | WO 99/34255 | 7/1999 |
| 2008/0252876 A1* | 10/2008 | Mengel et al. ................ 356/51 | | WO | WO 99/49366 | 9/1999 |
| 2009/0021726 A1* | 1/2009 | Wegmann et al. ........... 356/124 | | WO | WO 99/49504 | 9/1999 |
| 2009/0109418 A1 | 4/2009 | Hazelton et al. | | WO | WO 99/49504 A1 | 9/1999 |
| | | | | WO | WO 99/50712 | 10/1999 |
| | FOREIGN PATENT DOCUMENTS | | | WO | WO 99/60361 A1 | 11/1999 |
| | | | | WO | WO 99/66370 | 12/1999 |
| DE | 224 448 A1 | 7/1985 | | WO | WO 01/08205 A1 | 1/2001 |
| DE | 44 15 003 | 6/1995 | | WO | WO 01/63233 | 8/2001 |
| DE | 44 01 978 | 7/1995 | | WO | WO 02/063664 | 8/2002 |
| DE | 101 099 29 | 11/2001 | | WO | WO 02/090905 A2 | 11/2002 |
| DE | 100 65 127 | 8/2002 | | WO | WO 02/091078 | 11/2002 |
| EP | 1 500 982 A1 | 1/2005 | | WO | WO 03/077036 | 9/2003 |
| EP | 1 510 870 | 3/2005 | | WO | WO 03/077037 A1 | 9/2003 |
| EP | 1510870 | 3/2005 | | WO | WO 2004/019128 A2 | 3/2004 |
| EP | 1 662 554 A1 | 5/2006 | | WO | WO 2004/053596 | 6/2004 |
| EP | 1 670 039 | 6/2006 | | WO | WO 2004/055803 A1 | 7/2004 |
| EP | 1670039 | 6/2006 | | WO | WO 2004/057295 | 7/2004 |
| JP | A-59-19912 | 2/1982 | | WO | WO 2004/057589 A1 | 7/2004 |
| JP | 57-117238 | 7/1982 | | WO | WO 2004/057590 A1 | 7/2004 |
| JP | A 57-153433 | 9/1982 | | WO | WO 2004/057295 | 8/2004 |
| JP | A-58-202448 | 11/1983 | | WO | WO 2004/077154 A2 | 9/2004 |
| JP | 59-226317 | 12/1984 | | WO | WO 2004/081666 A1 | 9/2004 |
| JP | A-62-65326 | 3/1987 | | WO | WO 2004/090577 A2 | 10/2004 |
| JP | A-1-6560 | 3/1992 | | WO | WO 2004/090633 A2 | 10/2004 |
| JP | A-4-305915 | 10/1992 | | WO | WO 2004/090634 A2 | 10/2004 |
| JP | A-4-305917 | 10/1992 | | WO | WO 2004/092830 A2 | 10/2004 |
| JP | A-5-662877 | 3/1993 | | WO | WO 2004/092833 A2 | 10/2004 |
| JP | A-5-53120 | 2/1994 | | WO | WO 2004/093130 A2 | 10/2004 |
| JP | A-6-124873 | 5/1994 | | WO | WO 2004/093159 A2 | 10/2004 |
| JP | A-6-188169 | 7/1994 | | WO | WO 2004/093160 A2 | 10/2004 |
| JP | A-5-283403 | 10/1994 | | WO | WO 2004/095135 A2 | 11/2004 |
| JP | A-7-176468 | 7/1995 | | WO | WO 2005/001432 A2 | 1/2005 |
| JP | A-7-220990 | 8/1995 | | WO | WO 2005/001572 A2 | 1/2005 |
| JP | A-8-1666475 | 6/1996 | | WO | WO 2005/003864 A2 | 1/2005 |
| JP | A-8-316125 | 11/1996 | | WO | WO 2005/006026 A2 | 1/2005 |
| JP | A-8-316133 | 11/1996 | | WO | WO 2005/008339 A2 | 1/2005 |
| JP | A-8-330224 | 12/1996 | | WO | WO 2005/010611 A2 | 2/2005 |
| JP | A-09-184787 | 7/1997 | | WO | WO 2005/013008 A2 | 2/2005 |
| JP | A-10-160582 | 6/1998 | | WO | WO 2005/015283 A1 | 2/2005 |
| JP | A-10-163099 | 6/1998 | | WO | WO 2005/017625 A2 | 2/2005 |
| JP | A-63-157419 | 6/1998 | | WO | WO 2005/019935 A2 | 3/2005 |
| JP | A-10-189427 | 7/1998 | | WO | WO 2005/022266 A2 | 3/2005 |
| JP | A-10-214783 | 8/1998 | | WO | WO 2005/024325 A2 | 3/2005 |
| JP | 103 03 114 | 11/1998 | | WO | WO 2005/024517 A2 | 3/2005 |
| JP | A-10-303114 | 11/1998 | | WO | WO 2005/034174 A2 | 4/2005 |
| JP | A-10-340846 | 12/1998 | | | | |

| | | | |
|---|---|---|---|
| WO | WO 2005/050324 A2 | 6/2005 |
| WO | WO 2005/054953 A1 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Sep. 16, 2009 Office Action, with English translation, for Israeli Patent Application No. 174296.
Nov. 4, 2009 Office Action, with English translation, for Japanese Patent Application No. 2004-284218.
Nov. 4, 2009 Office Action, with English translation, for Japanese Patent Application No. 2004-281566.
Mar. 28, 2008 Office Action, with English translation, for Chinese Patent Application No. 2004-800299732.
Feb. 2, 2010 Office Action, with English translation, for Japanese Patent Application No. 2004-281566.
May 6, 2010 Notice of Allowance, with English translation, for Japanese Patent Application No. 2004-281566.
Feb. 2, 2010 Notice of Allowance, with English translation, for Japanese Patent Application No. 2004-284218.
Jan. 9, 2009 Notice of Allowance, with English translation, for Chinese Patent Application No. 2004-800299732.
Apr. 26, 2005 International Search Report, with English translation, for International Application No. PCT/JP2004/014693.
Apr. 26, 2005 Written Opinion, with English translation, for International Application No. PCT/JP2004/014693.
Jun. 7, 2011 Office Action issued in U.S. Appl. No. 11/403,922.
Mar. 16, 2011 European Search Report for European Patent Application No. 10196145.6.
Jan. 30, 2011 Office Action, with English translation, for Chinese Patent Application No. 2009-10129712.2.
Mar. 22, 2011 European Search Report for European Patent Application No. 10196147.2.
Jan. 12, 2011 Notice of Allowance issued in U.S. Appl. No. 11/896,447.
Oct. 25, 2010 Office Action issued in U.S. Appl. No. 11/403,922.
Apr. 15, 2011 Office Action, with English translation, for Korean Application No. 2006-7006005.
May 19, 2009 Japanese Office Action, with English translation, for Japanese Application No. 2005-512083.
Nov. 25, 2008 Japanese Office Action, with English translation, for Japanese Application No. 2005-512083.
May 6, 2010 Notice of Allowance, with English translation, for Japanese Application No. 2005- 512083.
Switkes et al., "Resolution Enhancement of 157nm lithography by liquid immersion," J. Microlith., Microfab., Microsyst., vol. 1 No. 3, Oct. 2002, Society of Photo-Optical Instrumentation Engineers, pp. 1-4.
S. Owa et al., "Nikon F2 Exposure Tool," Nikon Corporation, $3^{rd}$ 157nm symposium, Sep. 4, 2002, 25 pages (slides 1-25).
S. Owa et al., "Potential Performance and feasibility of immersion lithography," Nikon Corporation, NGL Workshop, Jul. 10, 2003, 33 pages (slides 1-33).
Nikon Corporation, Immersion Lithography Workshop, Dec. 11, 2002, 24 pages (slides 1-24).
Jun. 17, 2008 European Search Report issued in European Patent Application No. 04788458.0.
Apr. 30, 2008 Office Action issued in U.S. Appl. No. 11/403,922.
Feb. 2, 2009 Office Action issued in U.S. Appl. No. 11/403,922.
Jun. 10, 2009 Office Action issued in U.S. Appl. No. 11/403,922.
Dec. 2, 2009 Office Action issued in U.S. Appl. No. 11/403,922.
Nov. 24, 2008 Office Action issued in U.S. Appl. No. 1 1 /896,447.
Aug. 5, 2009 Office Action issued in U.S. Appl. No. 11/896,447.
Dec. 11, 2008 Office Action issued in European Patent Application No. 04788458.0.
Mar. 29, 2010 Notice of Allowance in U.S. Appl. No. 11/606,909.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
Optical Microlithography XVI, Proceedings of SPIE vol. 5040 (2003), "Immersion lithography; its potential performance and issues", Soichi Owa et al., pp. 724-733.
Nikon Corporation, Immersion Workshop, Jan. 27, 2004, "Update on 193 nm immersion exposure tool", S. Owa et al., 38 pages (slides 1-38).
Nikon Corporation, Litho Forum, Jan. 28, 2004, "Update on 193 nm immersion exposure tool", S. Owa et al., 51 pages (slides 1-51).
Sep. 29, 2008 Office Action in U.S. Appl. No. 11/606,909.
Apr. 21, 2009 Office Action in Application No. 11/606,909.
Nov. 12, 2009 Notice of Allowance in U.S. Appl. No. 11/606,909.
Aug. 20, 2007 Supplementary European Search Report in European Application No. 04748072.8.
Nov. 2, 2004 International Search Report in Application No. PCT/JP2004/010863, with translation.
Nov. 2, 2004 Written Opinion in Application No. PCT/JP2004/010863, with translation.

* cited by examiner

DEVICE AND METHOD FOR THE OPTICAL MEASUREMENT OF AN OPTICAL SYSTEM BY USING AN IMMERSION FLUID

CROSS-REFERENCE TO RELATED APPLICATIONS

This application is a continuation of U.S. application Ser. No. 12/147,034, filed Jun. 26, 2008, now abandoned, which is a continuation application of and claims priority to U.S. application Ser. No. 11/080,525, filed on Mar. 16, 2005, now U.S. Pat. No. 7,408,652, issued Aug. 5, 2008, which is a continuation-in-part of International Application PCT/EP2003/014663, with an international filing date of Dec. 19, 2003, which was published under PCT Article 21(2) in English, and the disclosure of which is incorporated into this application by reference; the following disclosure is additionally based on German Patent Application No. 102 61 775.9 filed on Dec. 20, 2002, which is also incorporated into this application by reference.

BACKGROUND

1. Field of the Invention

The invention relates to a device and a method for the optical measurement of an optical system, in particular an optical imaging system, having one or more object-side test optics components to be arranged in front of the optical system to be measured, and/or one or more image-side test optics components to be arranged behind the optical system to be measured, to a container which can be used for such a device, and to a microlithography projection exposure machine equipped with such a device. The designations "object-side" and "image-side" indicate, in the way they are used specifically in the case of optical imaging systems, that the relevant test optics component is intended for positioning in the beam path of a used measuring radiation in front or, respectively, behind the optical system to be measured.

2. Description of the Related Art

Such devices and methods are known in various forms, in particular for measuring optical imaging systems with regard to aberrations. One field of application is the highly accurate determination of aberrations of high-aperture imaging systems such as are used, for example, in microlithography systems for patterning semiconductor components by means of the so-called wavefront detection using shearing interferometry, point diffraction interferometry and other known types of interferometer such as the Ronchi type and Twyman-Green type, or by means of Moiré measuring techniques. In most cases of these techniques, a periodic or wavefront-forming structure is arranged on the object side and imaged by the optical imaging system to be measured, and brought into superimposition or interference with the periodic structure provided on the image side. The interference or superimposition pattern produced can be recorded with the aid of a suitable detector and evaluated in order to adjust and/or qualify the optical imaging system. When the same radiation, for example UV radiation, is used for wavefront measurement as is used by the optical imaging system in its normal operation, it being possible for the measuring device to be integrated in one component with the imaging system, this is also denoted as a so-called system or operational interferometer (OI). A device of this type is disclosed, for example, in laid-open publication DE 101 09 929 A1.

Various methods are known in the literature for increasing the resolution of an optical imaging system, such as reducing the wavelength of the light used in the imaging, and increasing the image-side numerical aperture of the imaging system. The latter is achieved in so-called immersion objectives by using an immersion fluid: see, for example, the projection exposure machines operating with immersion as disclosed in laid-open publications JP 10303114 A and JP 12058436 A.

On the basis of shearing interferometry, such an OI device usually comprises an illuminating mask, also termed coherence mask, and an upstream illuminating optics on the object side, that is to say on the object side of the optical system to be measured, also denoted below as OUT (object under test). Adjoining the OUT on the image side is a diffraction grating, followed by a detector element such as a CCD array, with the optional interposition of imaging optics which project the exit pupil of the OUT onto the detector plane of the detector element. It is mostly the case that the coherence mask is arranged in the object plane, and the diffraction grating is arranged in the image plane of the OUT. In accordance with the spacing conditions to be observed for the optical beam guidance, there are respective interspaces between the object-side last test optics component of the measuring device and the OUT, between the OUT and the image-side first test optics component of the measuring device, and/or between respectively consecutive test optics components on the object side and/or the image side of the OUT.

These interspaces are customarily either open, that is to say in the interspaces the radiation used traverses an atmosphere which corresponds to that of the system neighbourhood, for example air, nitrogen or a vacuum atmosphere, or closed, and are operated or purged with the aid of a prescribed gas atmosphere.

Under these conditions, it is normally possible to use such measuring devices to measure imaging systems up to numerical apertures of the order of magnitude of 0.95. The measurement of objectives of higher numerical aperture of the order of magnitude of 1.0 and above, as in the case of objectives which are used in immersion and near-field lithography, is therefore scarcely possible.

A primary technical problem underlying the invention is to provide a device of the type mentioned at the beginning which, with relatively low outlay, permits even optical imaging systems of very high numerical aperture to be measured, and can be of relatively compact design, to provide a corresponding method and a container suitable for use in such a device, and to provide a microlithography projection exposure machine equipped with such a device.

SUMMARY

The invention solves this problem by providing, in various aspects and formulations, a device, a container, a microlithography projection exposure machine, and a method having the features set forth in the independent claims and the description below.

In the device according to the invention, an immersion fluid can be and, in operation, is introduced adjacent to at least one of the one or more object-side test optics components and/or image-side test optics components. By contrast with a beam guidance without an immersion fluid, the beam guidance thereby enabled with the aid of immersion fluid permits the beam aperture angle or beam cross section to be reduced without loss of information in conjunction with an otherwise identical system dimensioning. Consequently, it is possible in this way to measure with sufficient accuracy even optical imaging systems with a very high aperture of the order of magnitude of 1.0 and more, for example using shearing interferometry wavefront detection. Furthermore, this results in the possibility of a very compact design of the measuring device.

In a development of the invention, one or more interspaces are formed between respectively two consecutive object-side test optics components, between respectively two consecutive image-side test optics components, between an object-side last test optics component and the following optical system to be measured, and/or between the optical system and a following, first image-side test optics component, and at least one of the interspaces forms an immersion fluid chamber for introducing immersion fluid. It is possible in this way for an immersion fluid to be introduced into a chamber at any desired point between two test optics components of the measuring device and/or between the optical system to be measured and a neighbouring test optics component.

A development of the invention is directed specifically at an interferometry measuring device which has on the image side in a customary way an interference pattern generating structure and a detector element. At least one immersion fluid chamber is formed between the test component and image-side interference pattern generating structure, and/or between the latter and a following test optics component and/or between the detector element and a preceding test optics component. The use of an immersion fluid between the image-side interference pattern generating structure and detector element permits a reduction in the beam aperture angle between these two test optics components, and a more compact design of the arrangement. In addition, advantages result with regard to the signal-to-noise ratio.

A development of the invention provides an interferometry device for wavefront detection which includes on the object side an interference pattern generating structure and upstream illuminating optics, at least one immersion fluid chamber being formed between the illuminating optics and the object-side interference pattern generating structure and/or between the latter and the test component. This also contributes to the fact that test components with a high aperture of, for example, 1.0 or more, such as projection objectives of microlithography systems, can be measured with the aid of this device without any problem.

In a development of the invention, the device is designed for measurement by means of shearing or point diffraction interferometry.

In a development of the invention, the device is of the dual-pass reflective type as an alternative to a single-pass design, which is also possible. Whereas in the case of the latter the radiation passes through the OUT only once, in the case of the dual-pass type it is directed back through the OUT by an image-side reflector element, and the detection is performed on the object side, that is to say on the same side of the OUT on which the other object-side test optics components, such as an object-side interference pattern generating structure and/or illuminating optics, are located. Such a dual-pass device can be, for example, of the type of a Twyman-Green interferometer.

In a development of the invention, the device comprises a device for continuous or intermittent exchange of immersion fluid, for example in a respective immersion fluid chamber.

In a refinement of the invention, a bellows arrangement, a sealing brush and/or sealing bar arrangement and/or a labyrinth seal arrangement are/is provided as transverse bounding of the respective immersion fluid chamber, which is bounded axially by the two adjacent optical components. Such seals are comparatively easy to implement and can also be used, in particular, in OI arrangements of microlithography projection objectives.

In one advantageous development of the invention, a quantum converter layer and/or at least one lens element and/or at least one liquid droplet are/is arranged on a radiation exit surface of a structure substrate as an image-side test optics component, which, for example, has an interference pattern generating structure. This measure makes it possible to avoid total internal reflection on this radiation exit surface of the structure mount, even for high beam angles, such as those which can occur, for example, in the case of large-aperture objectives to be measured, such as immersion objectives.

In one development of the invention, a fixed arrangement comprising a structure mount and downstream optics, such as a microscope objective or imaging optics, is provided as two image-side test optics components. This makes it easier to adjust these test optics components and, furthermore, contributes to keeping an area in which the optical characteristics are corrected small, thus simplifying the design and production of the microscope objective. If required, this measure can be combined with the fitting (as mentioned above) of one or more lens elements, one or more liquid droplets and/or a quantum converter layer on the radiation exit surface of the structure mount.

In a further refinement, an immersion liquid can be introduced into a space between the optical system to be measured and the structure mount, adjacent to a radiation inlet surface of the structure mount, advantageously combined with the measures mentioned above for arrangement of a quantum converter layer and/or at least one lens element and/or liquid droplet on the radiation exit surface of the structure mount, and/or the fixing of the structure mount and microscope objective relative to one another.

In a further refinement of the invention, an immersion liquid can be introduced into a space between the structure mount and a downstream detector element, for example a CCD array, adjacent to the radiation exit surface of the structure mount. In this case, the detector element or some other test optics component which is adjacent to the immersion liquid may be provided with a protection layer, thus protecting it against the influence of the immersion liquid.

The measures mentioned above for avoidance of total internal reflection advantageously allow multichannel wavefront measurement when required, even for very large aperture objectives, that is to say a parallel, simultaneous measurement on a plurality of measurement channels, that is to say field points, for example by lateral shearing interferometry.

In a development of the invention, a periodic structure used for forming an interference pattern or superimposition pattern is located in a container which is filled for the purpose of measuring with immersion fluid which covers the periodic structure. The container is positioned behind the optical system to be measured in such a way that an exit-end optical element of the optical system makes contact with the immersion fluid. For example, the interspace between the exit-end optical element of the optical system and the periodic structure can be completely filled with the immersion fluid. The container can, for example, be positioned such that the periodic structure lies in the image plane of an imaging system to be measured, or near the same.

In accordance with the invention, a container suitable for use in a device for measuring an optical system has a window inserted in a fluid-tight fashion into a cutout in the container wall. The window can be designed as an associated test optics component with the periodic structure, or the relevant test optics component is positioned in front of the window in the container. With the aid of the window, the interference pattern or superimposition pattern, which is formed, for example, approximately in the plane of the periodic structure, can be observed through the container wall such that an associated detector need not be arranged inside the container, and thus inside the immersion fluid, but can be positioned externally. Alternatively, or in addition to the abovementioned use on the image side, it is also possible to provide a container with an associated object-side test optics component for the purpose of object-side positioning.

In a refinement of the container, the window is made from fluorescing material. This permits a visualization of the radiation or the interference pattern or superimposition pattern even in cases in which operation is performed with invisible radiation, for example with UV radiation. In the case of the use of the Moiré measuring technique, this measure can render it possible for the detector to access the aperture of the Moiré strips more easily.

In an advantageous development of the invention, the said device has a container of the type according to the invention.

A device developed further in accordance with the invention serves for measuring optical systems by means of Moiré measurement technology. For this purpose, there is arranged in front of the optical system a periodic structure which generates a Moiré superimposition pattern with the image-side periodic structure. Normally, for this purpose the periodic structure on the image side, that is to say behind the optical system, is identical to or at least very similar to that on the object side, that is to say in front of the optical system, and the scale ratio of the two structures corresponds to that of the magnification ratio of the optical imaging system under test. The evaluation of the generated Moiré superimposition pattern can provide information on distortions and further aberrations of the optical system.

In an advantageous design of the device, the container is open at the top, and the opening is dimensioned such that when the container is positioned below the exit-end optical element of the optical system, a gap remains between this element and the container wall. For the purpose of adjustment and/or measurement, the container, and thus the periodic structure, can be moved by this gap using a suitable positioning device in any desired spatial directions relative to the exit-end element of the optical system. The gap also permits direct access to the immersion fluid, for example in order to eliminate disturbances to the beam path as a consequence of striations, gas bubbles or heat.

The measuring device according to the invention is integrated in the microlithography projection exposure machine according to the invention. In this case, the exposure machine can be, in particular, one of the customary types of scanner or stepper. The integrated measuring device can be used to measure a projection objective of the exposure machine in situ, that is to say there is no need for dismantling.

The method according to the invention can be carried out, in particular, with the aid of the device according to the invention.

DESCRIPTION OF DRAWINGS

Advantageous embodiments of the invention are illustrated in the drawings and described below. In the drawings.

DETAILED DESCRIPTION

Figure 1:
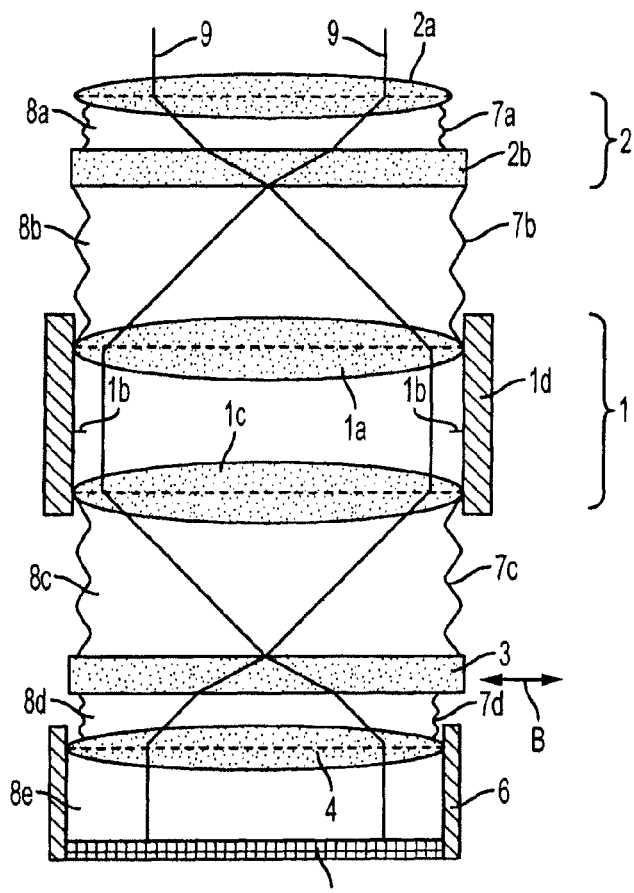
FIG. 1 shows a diagrammatic side view of an OI device for measuring an objective, for example used in a microlithography projection exposure machine, by means of shearing interferometry wavefront detection with the aid of immersion fluid and sealing bellows.

The device illustrated in FIG. 1 serves for the optical measurement of an objective 1, such as a projection objective of a microlithography projection exposure machine of the scanner or stepper type for semiconductor device patterning, the objective 1 being represented merely diagrammatically by an entrance-end lens 1a, an objective pupil 1b and an exit-end lens 1c, which are held in a ring holder 1d.

On the object-side of the objective 1 to be measured, the measuring device includes an illuminating module 2 of which there are shown an illuminating lens 2a and a following coherence mask 2b which functions as an object-side interference pattern generating structure. On the image side of the objective 1, the measuring device has a diffraction grating 3, functioning as an image-side interference pattern generating structure, a following micro-objective 4 and a detector element 5 downstream of the latter. The micro-objective 4 and detector element 5 are held in a ring holder 6.

The coherence mask 2b is in the object plane of the objective 1. As indicated by a movement arrow B, the diffraction grating 3 is arranged such that it moves laterally in the image plane of the objective 1. The coherence mask 2b and the diffraction grating 3 are provided with suitable structures for wavefront detection by means of shearing interferometry, as is known per se.

The micro-objective projects the pupil of the objective 1 onto the detector element 5, which is implemented as a CCD array of an imaging camera, for example. The shearing interferometry interference patterns picked up by the detector element 5 are evaluated in an evaluation unit (not shown) for determining the imaging behaviour and/or the aberrations, i.e. imaging errors, or wave aberrations in a conventional way.

In this respect, the device is of a conventional type and therefore requires no further explanations. Apart from these conventional measures, it is provided that one or more of the interspaces existing between the optical components used are delimited in a fluid-tight fashion by means forming a fluid chamber such that it can be filled with an immersion fluid.

For this purpose, in the example shown in FIG. 1 bellows means are provided which bound the respective interspace radially, that is to say transverse to the beam path or the optical axis of the imaging system, while it is bounded axially by the respectively adjacent optics component. In detail, FIG. 1 shows a first bellows 7a, which bounds the interspace between the illuminating objective 2a and the downstream coherence mask 2b with the formation of a first immersion fluid chamber 8a. A second bellows 7b bounds the interspace between the coherence mask 2b and the entrance-end lens 1a of the objective 1 in order to form a second immersion fluid chamber 8b. A third bellows 7c bounds the interspace between the exit-end objective lens 1c and the downstream diffraction grating 3 with the formation of a third immersion fluid chamber 8c. A fourth bellows 7d bounds the interspace between the diffraction grating 3 and the micro-objective 4 with the formation of a fourth immersion fluid chamber 8d.

Moreover, the ring holder 6 forms a part of the means forming the fluid chamber, by virtue of the fact that it radially bounds the interspace between the micro-objective 4 and detector element 5 in a fluid-tight fashion with the formation of a further immersion fluid chamber 8e.

Filling the immersion fluid chambers 8a to 8e with a respectively suitable immersion fluid influences the beam path such that the respective aperture angle and the beam cross section are reduced in conjunction with an otherwise identical system dimensioning, as follows from the edge beam path 9 shown diagrammatically in FIG. 1. As a consequence of this, by comparison with a system design without immersion fluid in the chambers 8a to 8e sealed by the bellows 7a to 7d, it is possible for the objective 1 with a higher numerical aperture to be measured in a spatially resolved fashion over its entire pupil, and/or for the measuring device to be implemented with a more compact design.

In alternative embodiments, only one, two, three or four of the five immersion fluid chambers 8a to 8e shown in FIG. 1 are formed by dispensing with one or more of the bellows 7a and 7d and/or a fluid-tight design of the ring holder 6. Instead of the bellows 7a to 7d or the ring holder 6, it is possible to use any other conventional means forming a fluid chamber in order to seal the relevant interspace between two consecutive optics components in each case. As is obvious to the person skilled in the art, the immersion fluid to be used can be selected in a suitable way, in a fashion adapted to the application, from the fluids known for this purpose, in particular with respect to their refractive index and with regard to not damaging the adjacent surfaces of the optics components and the means forming a fluid chamber. Thus, for example, in the case of applications with an operating wavelength of 193 nm, deionized water with a refractive index of 1.47 is suitable as immersion fluid, it being possible for the respective immersion fluid chamber to have an axial extent of several millimeters. Perfluoropolyether, for example, for which the transmittance is approximately 90% given an axial length of 50 μm for the immersion fluid chamber, is suitable in the case of an operating wavelength of 157 nm. Further conventional immersion fluids which can presently be used are lithium salts and strontium salts for UV radiation, as well as halogen-free oil immersions for operating wavelengths below 400 nm, e.g. at 248 nm.

Figure 2:
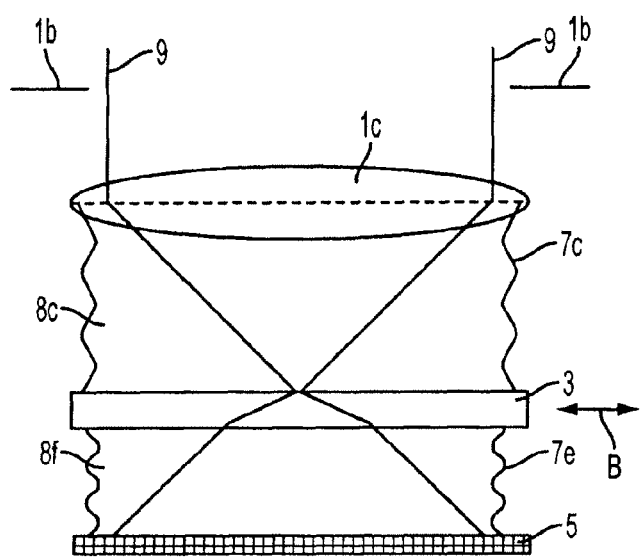
FIG. 2 shows a diagrammatic side view of the image-side part of an OI device similar to FIG. 1, but for a variant without additional imaging optics between a diffraction grating and a detector element.

FIG. 2 shows the image-side part of a compact OI variant of FIG. 1, which differs from the exemplary embodiment of FIG. 1 in that the detector element 5 follows the diffraction grating 3 as the next optics component without the interposition of imaging optics. To ease comprehension, identical reference symbols are chosen in FIG. 2 for functionally equivalent component parts, which need not necessarily be identical. The interspace existing between the diffraction grating 3 and the detector element 5 is sealed by a bellows 7e in a fluid-tight fashion radially outwards to form an immersion fluid chamber 8f. Otherwise, one or more further immersion fluid chambers can be formed in accordance with FIG. 1 in the upstream system part, for example the third immersion fluid chamber 8c, shown explicitly in FIG. 2, between the exit-end objective lens 1c and the diffraction grating 3.

The introduction of an immersion fluid into the chamber 8f between the diffraction grating 3 and detector element 5 is particularly advantageous in the case of the variant of FIG. 2. This is because, as may be seen in FIG. 2 with the aid of the edge beam path 9, the aperture angle of the radiation leaving the diffraction grating 3 is reduced compared to the beam path without immersion fluid, and thus permits the use of a detector element 5 having reduced areal requirement for the given numerical aperture of the OUT. This benefits a more compact design of the overall system.

Figure 3:
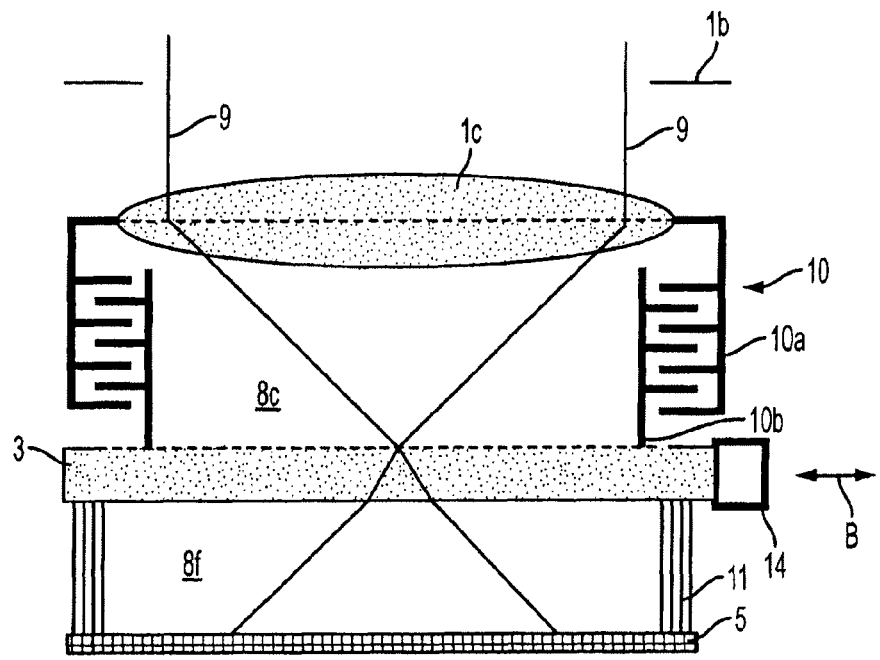
FIG. 3 shows a diagrammatic side view of the image-side part of an OI device similar to FIG. 2, but for a variant with labyrinth seal and sealing brush or sealing bar arrangements instead of bellows seals.

In the example shown, an immersion fluid with a refractive index greater than that of the diffraction grating substrate 3 is selected, with the consequence that the aperture angle of the radiation is smaller after exit from the diffraction grating substrate 3 than in the latter. Alternatively, immersion fluids with a lower refractive index than that of the diffraction grating substrate 3 can be used, as is illustrated in the example of FIG. 3. If required, it is possible to dispense with otherwise customary antireflection coating on the diffraction grating 3 by adapting the refractive indices of immersion fluid and diffraction grating 3.

A further advantage of introducing an immersion fluid into the immersion fluid chambers formed precisely in the image-side part of the measuring device consists in that the signal-to-noise ratio and thus the measuring accuracy can be improved, since the detected intensity of image points in the edge region decreases with the fourth power of the cosine of the aperture angle.

In a view corresponding to FIG. 2, FIG. 3 shows a variant of the compact OI device of FIG. 2 in the case of which the radial sealing of the immersion fluid chamber 8c between the exit-end objective lens 1c and the diffraction grating 3 is implemented by a bipartite labyrinth seal 10 of which an outer cylindrical ring 10a adjoins the exit-end objective lens 1c, and an inner cylindrical ring 10b is coupled to the diffraction grating 3. The outer ring 10a is provided on its inside with a plurality of radially inwardly projecting labyrinth rings which are arranged at an axial spacing and in whose interspaces radially outwardly projecting labyrinth rings of the inner cylindrical ring 10b engage such that a narrow labyrinth duct is formed. The narrow labyrinth duct holds immersion fluid in the immersion fluid chamber 8c because of its surface tension. At the same time, this labyrinth seal 10 permits adequate lateral mobility of the diffraction grating 3 with reference to the exit-end objective lens 1c by virtue of the fact that the comb-like interlocking labyrinth rings can be moved laterally relative to one another without varying the width of the labyrinth duct. The lateral movement of the diffraction grating 3 is effected in this example by means of a customary lateral movement actuator 14.

As a further difference from the exemplary embodiment of FIG. 2, in the example of FIG. 3 the immersion fluid chamber 8f between the diffraction grating 3 and the detector element 5 is sealed radially by a sealing brush arrangement 11 which consists of individual brush hairs 11 which project upwards axially from the detector element 5 and are arranged in the shape of a ring. Alternatively, a sealing bar arrangement comprising a plurality of coaxial bar rings, which leave a narrow annular gap between them, or a sealing lip arrangement can be provided. As in the case of the labyrinth seal 10, because of the action of surface tension or capillary force, the narrow interspaces of the brushes or bars are sealed by the immersion fluid itself. If required, grooves suitable for amplifying the effect of surface tension can be introduced into the surface regions relevant to sealing.

Figure 4:
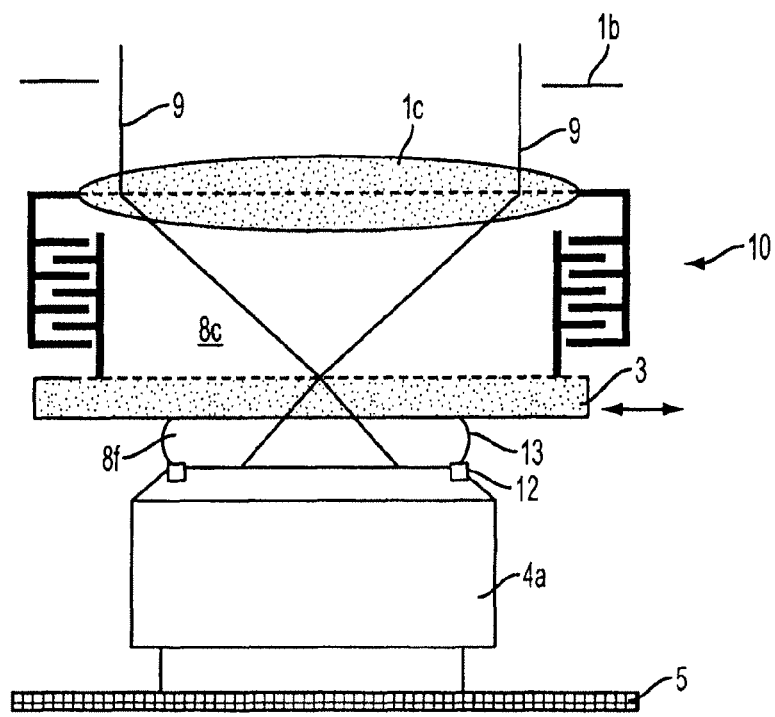
FIG. 4 shows a diagrammatic side view of the image-side part of an OI device similar to FIG. 1 for a variant with a labyrinth seal between the OUT and a diffraction grating, as well as sealing based on surface tension between the diffraction grating and a micro-objective.

In an illustration similar to FIGS. 2 and 3, FIG. 4 shows a further variant of the OI device of FIG. 1, which differs from the latter in the image-end part by virtue of the fact that, firstly, the labyrinth seal 10 in accordance with FIG. 3 is provided for sealing between the exit-end objective lens 1c and diffraction grating 3 and, secondly, use is made for the purpose of sealing the immersion fluid chamber 8f between the diffraction grating 3 and a microscope objective 4a functioning as microobjective solely of the effect of surface tension or capillary force of the introduced immersion fluid, for which purpose an annular groove 12 along the edge region of the plane front side of the microscope objective 4a is provided in a supporting fashion. The lateral extent of the immersion fluid introduced into the immersion fluid chamber 8f thus formed stabilizes on the outside by its surface tension at the annular groove 12 of the microscope objective 4a with the formation of a corresponding, outwardly curved edge face 13. It goes without saying that this type of sealing is confined to interspaces with a comparatively small axial height. As in the case of the above-mentioned bellows, brush, bar or sealing lip arrangements, the sealing variant of FIG. 4 also permits an adequate lateral mobility of the diffraction grating 3. A lateral relative movement of the diffraction grating 3 relative to the OUT 1 is desired for purposes of adjustment and for locating the focal position, while a lateral movement of the diffraction grating 3 relative to the detector element 5 or micro-objective 4, 4a is desired for the phase-shifting operation of shearing interferometry.

In the examples shown, it becomes clear that owing to the introduction of immersion fluid between the objective 1 and the image-side grating 3 it is possible for the field area defined by the numerical aperture of the objective 1 to be imaged completely even in the case of very high aperture values, and that a high resolving power is achieved when the measuring device is installed as an OI device at the place of use of the objective 1, for example in a projection exposure machine of a microlithography system. In normal operation, during the exposure process a wafer to be exposed, for example with photoresist, is located in the image plane, and so the OI device can advantageously be installed in a stepper or scanner, the immersion fluid chamber corresponding to and even promoting the conditions of use for the latter. Filling one or more of the object-side interspaces, such as the interspace between the object-side interference pattern generating structure 2b, where, for example, a reticle is located when the objective 1 is in use, and the objective 1 permits the objective to be designed with smaller lens diameters.

In addition to introducing immersion fluid in front of the micro-objective 4, 4a, the latter is designed such that it is suitable for testing objectives 1 with numerical apertures of up to approximately 0.9, since its numerical aperture must be greater than or equal to that of the OUT 1 if, as desired, the entire objective pupil is to be measured. Moreover, it is possible for the very first time in this way also to measure objectives with numerical apertures of greater than approximately 0.95 or even greater than 1.0 with relatively low outlay by using this technique. If required, an immersion fluid can also be located in the micro-objective 4, 4a between optical components of the same.

Figure 5:
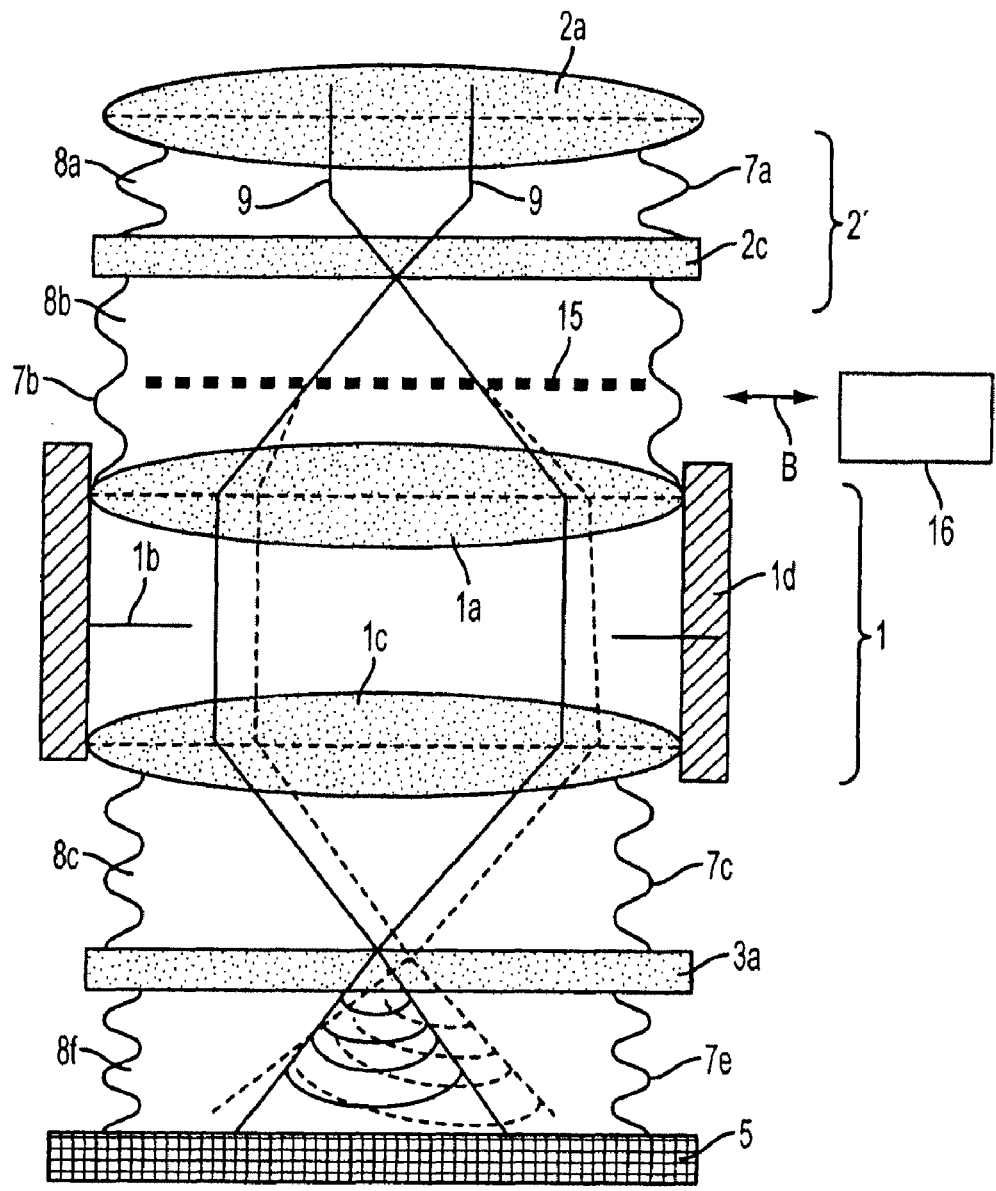
FIG. 5 shows a diagrammatic side view of an OI device according to FIG. 1 but in a design for objective measurement by means of point diffraction interferometry.

In a view corresponding to FIG. 1, FIG. 5 shows an exemplary embodiment of the point diffraction interferometer type. On the object side of the objective 1 to be measured, this measuring device includes an illuminating module 2' with an illuminating lens 2a and a following pinhole mask 2c functioning as object-side interference pattern generating structure. The said mask is arranged in the object plane of the OUT 1 for the purpose of generating a first spherical wave. A beam splitter in the form of a diffraction grating 15 is provided between the pinhole mask 2c and the entrance-end lens 1a of the OUT 1, in order to generate a second spherical wave coherent to the first one. Alternatively, this beam splitter diffraction grating 15 can be arranged in front of the object-side pinhole mask 2c or on the image side between the exit-end objective lens 1c and a further, image-side pinhole mask 3a which is preferably located in the image plane of the objective 1. For the purpose of phase shifting, the beam-splitting diffraction grating 15 is arranged, in turn, such that it can be moved laterally by a corresponding lateral movement actuator 16, as symbolized by the movement arrow B.

The second pinhole mask 3a, positioned in the image plane or, alternatively, in the vicinity of the image plane of the objective 1, has a second pinhole, in order to generate a spherical reference wave by diffraction. The radiation for generating the reference wave originates from the imaging by the objective 1 of the first or second of the spherical waves supplied by the beam-splitting diffraction grating 15, which are represented diagrammatically in FIG. 5 by continuous or dashed lines respectively, it being possible for a different diffraction efficiency, and thus different intensities of superimposition to result depending on the design of the beam-splitting grating 15. An important parameter for the intensity of superimposition is also the pinhole size.

Apart from the pinhole, the second, image-side pinhole mask 3a has, as is usual in the case of point diffraction interferometers, a second, larger opening for the free passage of the OUT wave. The result of this on the detection plane of the detector element 5 is the coherent superimposition of reference wave and OUT wave, and the resulting interference pattern can be detected by the detector element 5 in a spatially resolving fashion, and be evaluated in the usual way by means of a downstream evaluation unit. The phase shift mentioned is advantageous here, but not necessary in principle, since the relative tilting of OUT and reference waves results in multiple fringe inter-ferograms from which the phase shift can be calculated with the aid of multiple fringe evaluation methods.

Characteristic, in turn, of the device of FIG. 5 is the formation of the immersion fluid chambers 8a, 8b, 8c, 8f from the interspaces between the optics components mentioned with the aid of suitable means forming the fluid chambers, here, once again by the bellows 7a, 7b, 7c, 7e, the beam-splitting diffraction grating 15 being arranged inside the immersion fluid chamber 8b, or dividing up the latter appropriately. It goes without saying that it is also possible to use the abovementioned, alternative means forming fluid chambers instead of the bellows. It also goes without saying that in variants of the device of FIG. 5 only some of the interspaces need to be sealed with the formation of a respective immersion fluid chamber.

Figure 6:
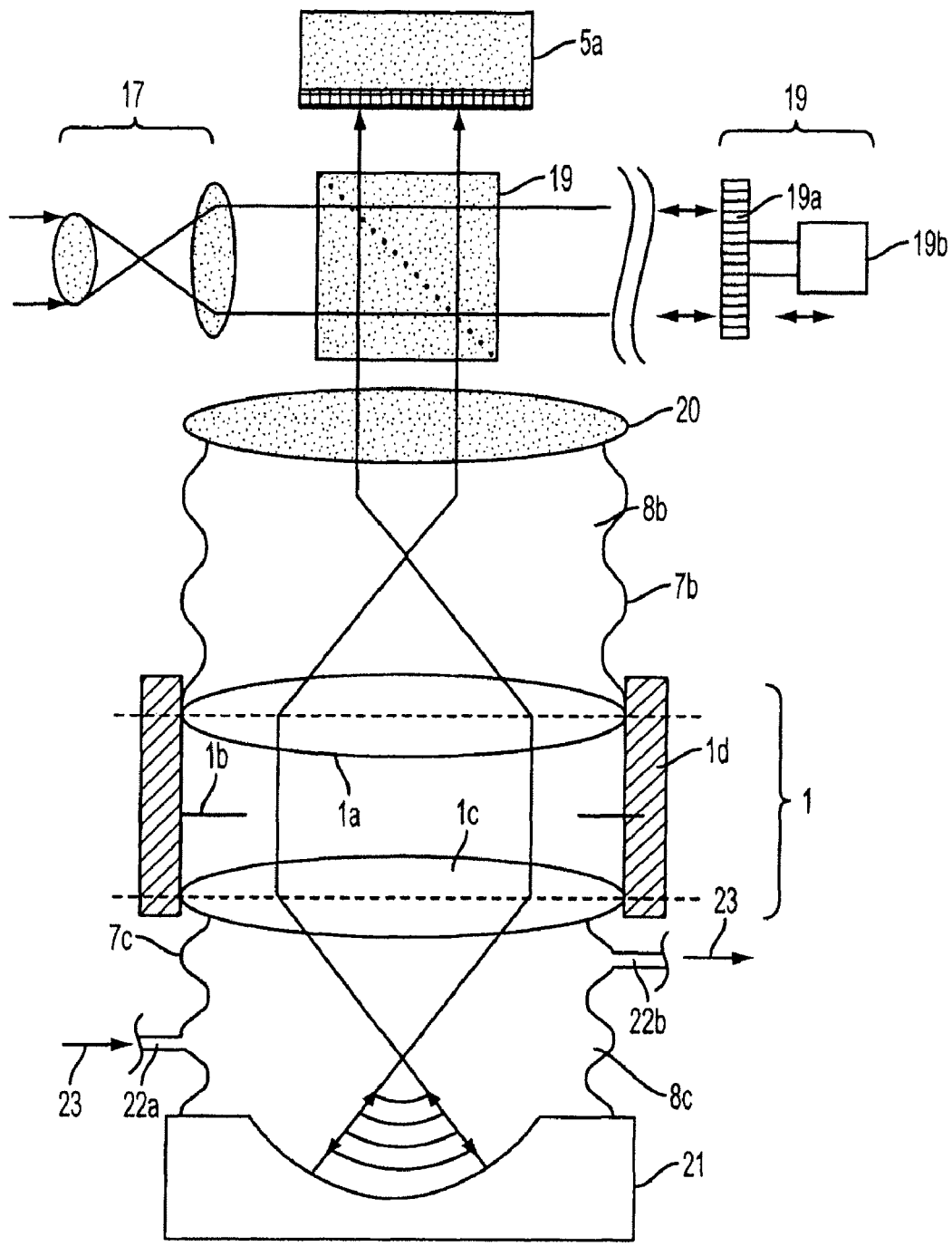
FIG. 6 shows a diagrammatic side view of a device for measuring an objective, for example used in a microlithography system, by means of phase-shifting Twyman-Green interferometry.

Whereas the above exemplary embodiments described measuring devices of the single-pass type, in the case of which the test radiation is led only once through the OUT, FIG. 6 shows a measuring device of the dual-pass type, specifically of the type of a Twyman-Green interferometer. Adjoining a light source (not shown), this device includes focusing optics 17 with a pinhole diaphragm as spatial filter, and an adjoining beam splitter 18, of which a first half deflects the radiation by 90° in the direction of the OUT 1, while the remaining radiation is passed without deflection to a reference system part 19 with a plane mirror 19a and an axial movement actuator 19b with the aid of which the plane mirror 19a can, as symbolized by double arrows, be moved axially for the purpose of phase shifting.

The radiation fraction reflected by the beam splitter 19 is focused by following focusing optics 20 into the object plane of the OUT 1, in order to provide a spherical test wave there. A spherical concave mirror 21 is arranged on the image side in such a way that its centre of curvature lies in the image plane of the OUT 1. Consequently, the radiation emerging on the image side from the OUT 1 is retroreflected through the latter again by the spherical concave mirror 21. In the ideal case, that is to say given perfect adjustment and without defects in the component parts, the outward and returning paths of the wave are identical. In general, with such dual-pass arrangements the reflecting surfaces are spherically curved, that is to say formed by concave or convex glass or mirror members, since the beam path is convergent at the exit end in the case of imaging objectives to be measured. The radiation then passes via the focusing optics 20 and the beam splitter 19 onto the detector plane of a detector element 5a which is arranged behind the beam splitter 19 and can be an image recording camera, for example. In addition, the reference radiation retroreflected by the reference system part 19 and deflected through 90° by the beam splitter 19 passes to the detector element 5a and interferes with the radiation which has passed twice through the OUT 1, as is usual in the case of the design of the Twyman-Green interferometer.

Characteristically, one immersion fluid chamber 8b, 8c is respectively formed by means of respective bellows 7b, 7c, alternatively, by means of one or the other, abovementioned sealing variants, on the object side and image side in a fashion adjacent to the OUT 1, that is to say on the object side between the focusing optics 20 and the entrance-end objective lens 1a, and on the image side between the exit-end objective lens 1c and the spherical concave mirror 21. The abovementioned properties and advantages of filling these interspaces with an immersion fluid are obtained, once again.

Figure 7:
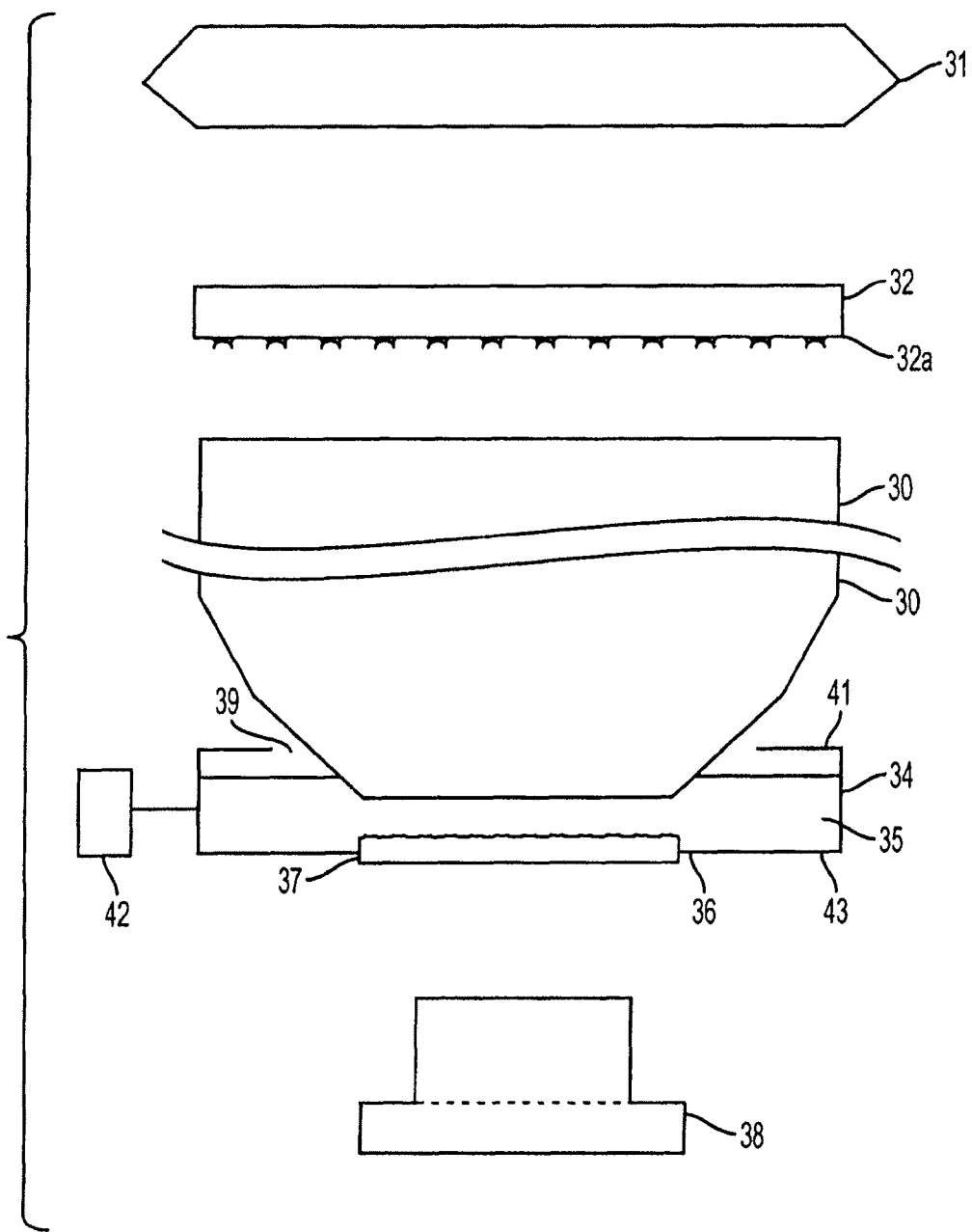
FIG. 7 shows a diagrammatic side view of a device for measuring an optical imaging system using Moiré measurement technology.

The device shown in FIG. 7 likewise serves for the highly accurate measurement of optical imaging systems, for example a high-resolution microlithography projection objective, which is illustrated merely diagrammatically and in an abbreviated fashion with an exit-end element 30, such as an exit-end lens, with regard to aberrations, in particular distortion. For this purpose, the device has an illuminating device 31 which can, for example, be a conventional illuminating system of a microlithography projection exposure machine, specifically in cases in which the measuring device is integrated in the exposure machine. The wavelength of the radiation supplied by the illuminating device 31 can lie, in particular, in the UV or EUV region.

The device also comprises an object-side test optics component 32, which is preferably to be positioned in the object plane of the projection objective and has a periodic structure 32a which is designed in this example as a Moiré pattern, typically with periodic Moiré strips.

The device also includes a container 34 which is to be positioned on the image side and can be filled with an immersion fluid 35 and has an upper cover 41 on the edge side into which a sufficiently large opening is let, through which the exit-end element 30 of the projection objective can pass, a movement gap 39 remaining between the opening edge and the penetrating optical element 30.

A further periodic structure 36, which is likewise designed as a Moiré pattern, is mounted on a window 37 which is inserted in a fluid-tight fashion in a cutout which is provided in a base wall 43 of the container 34. Alternatively, the image-side Moiré pattern 36 can also be positioned above and therefore in front of the window 37 on a carrier element fitted in the container 34, for example on a carrier plate. The window 37 can optionally be made from a fluorescing material which, in the event of use of a non-visible radiation such as UV radiation, permits the latter and/or the interference pattern or superimposition pattern to be visualized.

The device shown can be used to measure the projection objective with a low outlay at its operating site without the need for this purpose to remove it from the microlithography projection exposure machine. For this purpose, the object-side Moiré pattern 32a is brought into its desired object-side position, for example by inserting it into the beam path with the aid of a reticle holder in exchange for a reticle in the object plane which is used in normal operation. The container 34 is correspondingly filled with immersion fluid 35 such that the latter covers the Moiré pattern 36, and is positioned on the image side at a suitable point, for example in the image plane of the projection objective. This can be performed, for example, with the aid of a wafer holder which is used in normal operation to position a wafer to be exposed in the image plane. In other words, by exchanging the said components the microlithography projection exposure machine can easily be switched over from normal operation, that is to say the imaging of a reticle positioned in the object plane onto a wafer positioned in the image plane, to measurement operation. In the measurement operation position shown, the exit-end element 30 of the projection objective dips into the immersion fluid 35, that is to say the latter fills the interspace between the said objective and the image-side Moiré pattern 36.

In the measurement operation shown, the object-side Moiré pattern 32a is imaged by the projection objective onto the image-side Moiré pattern 36, such that superimposition of the image of the object-side Moiré pattern 32a and the image-side Moiré pattern 36 produces a Moiré superimposition pattern which is observed through the window 37 with the aid of a detector 38. In a way familiar to the person skilled in the art, aberrations, in particular distortion errors, of the projection objective are detected by appropriate evaluation of the Moiré superimposition pattern.

Depending on requirement, the movement gap 39 permits a movement of the container 34 in all spatial directions for the purposes of adjustment or measurement, for example a lateral and/or axial displacement, a tilting and/or rotation such that the container 34, and thus the associated Moiré pattern 36, can be positioned optimally for the measurement operation. The movement or positioning of the container 34 is accomplished by a suitably fitted and designed positioning unit 42. In addition, it is optionally possible for the object-side and/or image-side Moiré pattern 32a, 36 to be subjected to expansion, contraction or rotation in order to obtain a Moiré strip superimposition pattern which can be effectively evaluated, and/or to compensate aberrations of the projection objective partially in advance.

The movement gap 39 also permits direct access to the immersion fluid 35, and this permits the elimination of disturbing influences exerted by the latter on the measurement operation, such as striations, gas bubbles or thermal effects.

It goes without saying that the device shown is suitable for measuring not only a projection objective, but also any other desired optical imaging systems and other optical systems by means of Moiré measurement technology. The invention also comprises devices which are based on other conventional measuring techniques for determining aberrations of optical imaging systems and which make use of a periodic structure to be arranged on the object side and/or image side, in order to generate a superimposition pattern or interference pattern indicating aberrations. The invention is suitable for all normally used radiation wavelengths, such as for the use of an He—Ne laser at 632.8 nm, and other light sources such as are customary in lithography, in particular including those in the UV wavelength region and EUV wavelength region between 10 nm and 300 nm.

In all the exemplary embodiments shown, the immersion fluid can be introduced in a stationary fashion into the relevant immersion fluid chamber or the container, or alternatively, the respective immersion fluid chamber is flushed or refilled continuously or periodically with the immersion fluid. It is possible in this way to avoid any kind of disruptive effect owing to heating of the immersion fluid, and/or to achieve temperature control, for example cooling, of the adjacent optical components. Suitable conventional means are then provided for this purpose, in particular an inlet 22a and an outlet 22b into or from the immersion fluid chamber 8c, as shown in FIG. 6 by way of example for the case of the immersion fluid chamber 8c. In this way, the immersion fluid 23 can be conveyed in the circulation by means of a pump from a storage tank into the corresponding immersion fluid chamber, and extracted therefrom.

FIGS. 8 to 13 show further advantageous embodiments of the image-side part of an OI device for measurement of optical systems, in which case this image-side device part may, of course, also be used, in each case in a suitably modified form, for measurement devices which operate on the basis of one of the other measurement principles mentioned above. For the sake of clarity, only those components which are essential to the explanation of the special feature are illustrated, in each case schematically.

Figure 8:
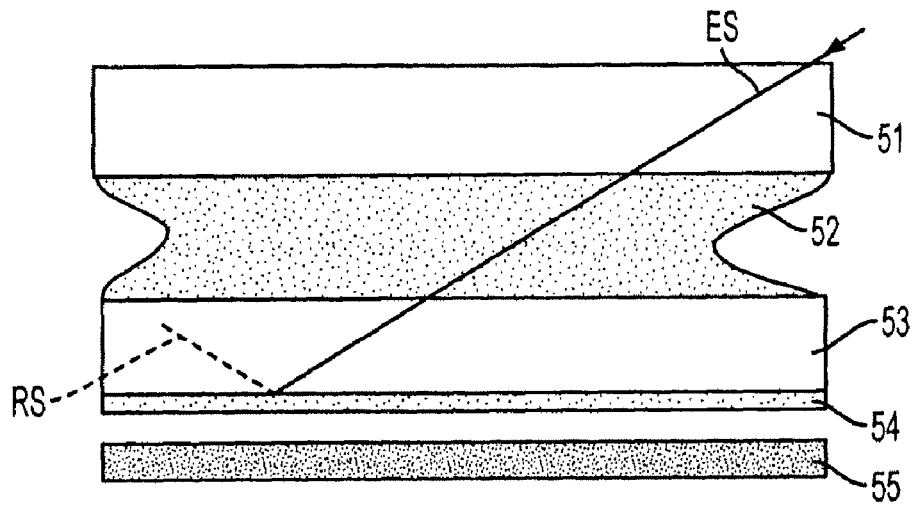
FIG. 8 shows a schematic side view of the image-side part of an OI device analogous to FIG. 1, but for a variant with a quantum converter layer on a structure mount radiation exit surface.

Specifically, FIG. 8 shows an image-side device part with a structure mount 53 which is arranged at a relatively short distance in the beam path behind an objective 51, which is indicated only schematically but is to be measured, and which may, in particular, be a microlithography projection objective as in the above exemplary embodiments. An immersion liquid 52, for example water, is introduced into the space between the objective 51 to be measured and the structure mount 53. On its radiation inlet side facing the objective 51, the structure mount 53 has a conventional interference pattern production structure, which is not shown in any more detail, such as a diffraction grating structure for OI measurement. A detector element 55, such as a CCD array, is located adjacent to the structure mount 53, without any gap, or at a very short distance. Alternatively, a faceplate can be inserted between the structure mount 53 and the detector element, and is mounted on the detector element 55. A certain distance between the detector element 55 and the structure mount 53, with or without a faceplate, reduces the thermal load on the structure mount 53 and the objective 51 caused by a detecting image recording camera.

This compact configuration of the detector part is suitable, for example, for an OI device which operates on the principle of parallel, that is to say multichannel, lateral shearing interferometry, and which is able to measure optical systems, in particular with respect to the aberrations which correspond to the Zernike coefficients Z2 to Z37, with in-line calibration preferably being provided. This detector configuration is also particularly suitable for measurement of objects with a very high numerical aperture NA, for example NA>1, as occurs, for example, in the case of so-called immersion objectives, whose design includes an immersion liquid.

In a situation such as this, unless further measures are taken, there is a risk of total internal reflection occurring on the radiation exit surface of the structure mount 53 owing to the high beam angles which occur, as is illustrated in FIG. 8 for an incident beam ES by means of a reflected beam RS, which is indicated by a dashed line, and is the result of total internal reflection of the incident beam ES at this boundary surface of the structure mount 53 with the air. In order to prevent this effect, a quantum converter layer 54 is applied to this radiation exit surface of the structure mount 53 in the exemplary embodiment shown in FIG. 8. The material of the quantum converter layer 54 is chosen such that it converts the incident radiation to radiation at a different wavelength, at which the total internal reflection effect does not occur. For example, the quantum converter layer 54 may be designed to transform incident radiation, for example at a wavelength of 193 nm to radiation at a sufficiently longer wavelength, for example to radiation at a wavelength of 550 nm.

Quantum converter layers of this type, for example fluorescent/luminescent layers, are known per se to those skilled in the art and are frequently applied, for example, to a CCD chip for the purpose of appropriate quantum conversion, so that they do not require any further explanation here. In the present case, the quantum converter layer 54 is located on the lower face, that is to say the radiation exit surface, of the structure mount 53, and the interferogrammes to be detected are produced in the quantum converter layer 54. The CCD array 55 is positioned at a sufficiently short distance, preferably of <10 μm, behind the quantum converter layer 54, in order to minimize striation of the radiation emitted from the quantum converter layer 54 into the entire hemisphere and thus of the interferogrammes to be detected on the CCD array 55. Alternatively, the CCD array 55 may be arranged in direct touching contact with the quantum converter layer 54, that is to say the substrate mount 53, the quantum converter layer 54 and the CCD chip 55 then form a sandwich structure.

Figure 9:
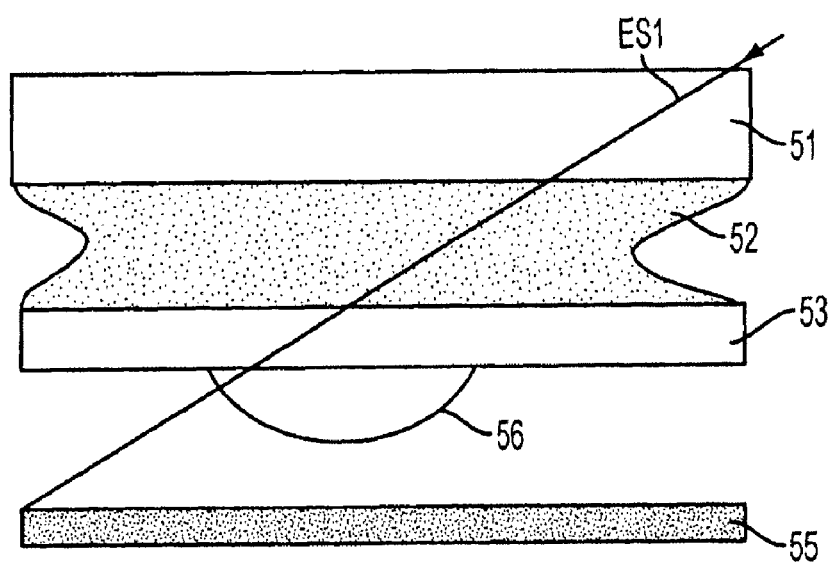
FIG. 9 shows a schematic side view, corresponding to FIG. 8, for a variant with a lens element on the radiation exit surface of the structure mount.

FIG. 9 shows a variant of the example shown in FIG. 8, with the same reference symbols being chosen here as in the further FIGS. 9 to 13 as well, for identical or functionally equivalent elements, for clarity purposes. The exemplary embodiment of FIG. 9 differs from that in FIG. 8 in that a lens element 56 rather than a quantum converter layer is fitted to the lower face of the substrate mount 53, that is to say on its radiation exit surface, for example by wringing. The lens element 56 may have a hemispherical shape, or, alternatively, an aspherical shape. If required, imaging errors caused by the detection optics formed by the lens element 56 may be corrected in a suitable manner, for example by using a conventional focus trick technique. Numerical wavefront correction can also be used, for example as described in U.S. patent application Ser. No. 10/766,014 from the same applicant, whose content is hereby included herein, in its entirety, by reference. As is symbolized by the incident beam ES1 which passes through as far as the CCD chip 55 in FIG. 9, the lens element 56 has a beam deflecting effect, which prevents total internal reflection from occurring on the radiation exit surface of the substrate mount 53. In this case, the CCD chip 55 is adjacent to, but at a suitable distance from, the substrate mount 53 with the lens elements 56 that has been wrung onto its lower face.

Figure 10:
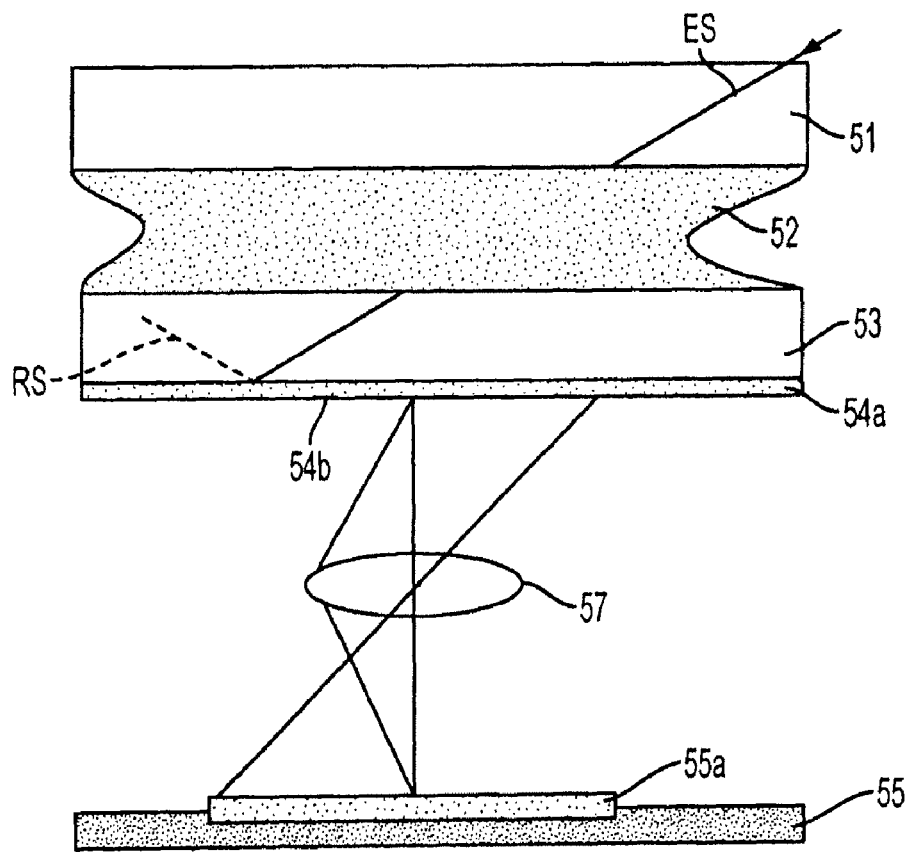
FIG. 10 shows a schematic side view, corresponding to FIG. 8, for a variant with additional imaging optics.

FIG. 10 shows a variant of FIG. 8, in which the interferogramme which is produced in an active image-producing area 54b of a quantum converter layer 54a on the lower face of the substrate mount 53, does not fall directly on a CCD chip which is in touching contact or is a short distance behind it, but is imaged by means of imaging optics 56 on a detection-active part 55a of the CCD array, or of the corresponding image recording camera 55. As in the case of FIG. 8, the quantum converter layer 54a to a major extent prevents the occurrence of total internal reflection, that is to say the reflected radiation RS marked by a dashed line, for light beams ES which are incident at large angles.

Figure 11:
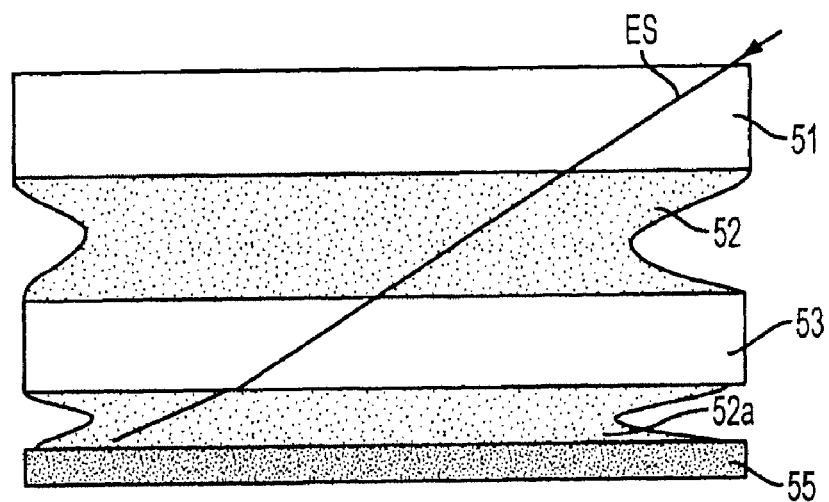
FIG. 11 shows a schematic side view, corresponding to FIG. 8, for a variant with immersion liquid between the structure mount and the downstream detector element.

FIG. 11 shows a variant of FIG. 8, in which an immersion liquid 52a is additionally introduced into the space between the structure mount 53 and the CCD chip 55, as well. This means that there is no boundary surface between the structure mount 53 and the air, thus avoiding the total internal reflection effect caused by this. A quantum converter layer on the lower face of the structure mount 53 may admittedly be provided if required, but is not absolutely essential, and FIG. 11 shows the situation without a quantum converter layer. It is also possible to provide a quantum converter layer or some other suitable protection layer on the CCD chip 55, in order to isolate it and the image recording camera from the immersion liquid 52a, and thus to protect them. Any other test optics component which is adjacent to an immersion liquid may be provided with a protection layer such as this in the same way.

It is self-evident that the measures mentioned above relating to the individual FIGS. 8 to 11 can also be combined in any other desired manner. Thus, for example, the lens elements 56 shown in FIG. 9 can be applied to the quantum converter layer 54 shown in FIG. 8, and/or the space between the structure mount 53 and the lens element 56 and the CCD chip 55 as shown in FIG. 9 can be filled with the immersion liquid 52a as shown in FIG. 11, which then surrounds the lens element 56. In a further embodiment of the invention, which is not illustrated, a plurality of individual lens elements may be fitted to the lower face of the structure mount 53 as a variant of FIG. 9.

The measures explained above with reference to FIGS. 8 to 11 advantageously provide the precondition to allow even objectives with very high numerical apertures to be measured on a number of channels by means of an appropriate wavefront measurement device, for example a device which operates with the aid of lateral shearing interferometry, that is to say simultaneously for a plurality of field points.

Figure 12:
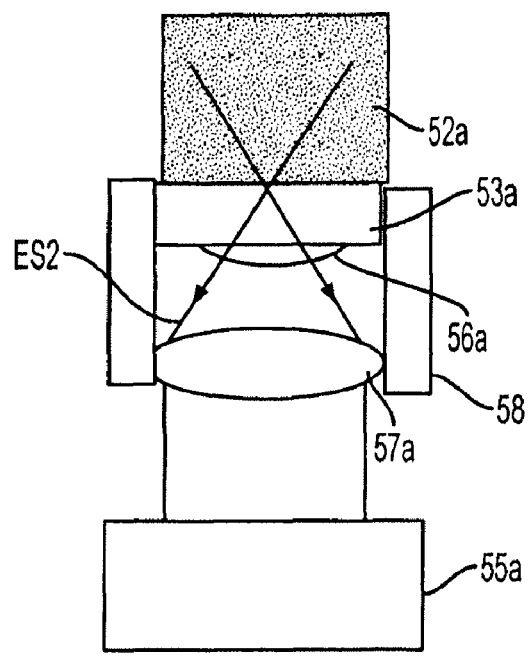
FIG. 12 shows a schematic side view of the image-side part of an OI device, analogous to FIG. 1, for a variant with a structure mount, having a lens element, and a microscope objective, fixed relative to one another.

FIG. 12 shows an exemplary embodiment of the image-side part of a measuring device, in which a structure mount 53a in the form of a structure mount 53 shown in FIGS. 8 to 11 and having a lens element 56a fitted to its lower face in the manner of the lens element 56 shown in FIG. 9 is mechanically rigidly coupled to a microscope objective 57a by means of an annular holder 58. As in the example shown in FIG. 9, the lens element 56a which is wrung onto the lower face of the structure mount 53a to a major extent avoids the occurrence of total internal reflection even for high incidence angles of the incident measurement radiation ES2, without the need for immersion liquid to be introduced into the space between the structure mount 53a with the lens element 56a wrung on it and the microscope object 57a, although this may optionally be provided. For this purpose, the lens element 56a is chosen such that it decreases the numerical aperture for the radiation ES2 to such an extent that all of the required beams can also propagate through the air to the microscope objective 57a and to a downstream image recording camera 55a with a CCD array.

Once again, an immersion liquid 52a is introduced into the beam path upstream of the structure mount 53a, adjacent to its radiation inlet surface, although this is indicated only schematically in FIG. 12. In this case, as in the situations in FIGS. 8 to 11, the immersion liquid 52a preferably fills the space between the exit surface of an optical system which is to be measured but is not shown in FIG. 12, in the same way as a microlithography projection objective, and the structure mount 53a. Only this intermediate space in the detection part of the measuring device is filled with the immersion liquid 52a in the example shown in FIG. 12, preferably being rinsed although this is not absolutely essential for the space between the structure mount 53a and the microscope objective 57a, as a result of the arrangement of the lens element 56a. The microscope objective 57a images the radiation onto the downstream imaging recording camera 55a.

Precise lateral and vertical adjustment of the microscope objective 57a relative to the structure mount 53a with the associated interference pattern production structure is of considerable importance for the measurement process, in particular for an OI measurement. The rigid mechanical coupling of these two components 53a, 57a by means of the holder 58 fixes the adjustment parameters, thus avoiding changes to these parameters. The fixing of the structure mount 53a and microscope objective 57a relative to one another also makes it possible to keep small specific design parameters, such as the area of sine correction, thus simplifying the design, production and manufacture of the microscope objective 57a.

As an alternative to the example illustrated in FIG. 12, the lens element 56a there may also be omitted, with immersion liquid being introduced, instead of this, into the space between the structure mount 53a and the microscope objective 57a, and/or with a quantum converter layer being provided on the lower face of the structure mount 53a. In a further alternative embodiment, which is not illustrated, the imaging optics 57 are, as a variant of the exemplary embodiment shown in FIG. 10, mechanically rigidly connected to the structure mount 53 via a holder in the form of the holder 58 shown in FIG. 12. A further variant of the example shown in FIG. 12, but which is not illustrated, dispenses with the rigid mechanical coupling of the structure mount 53a and microscope objective 57a, and thus with the holder 58.

Figure 13:
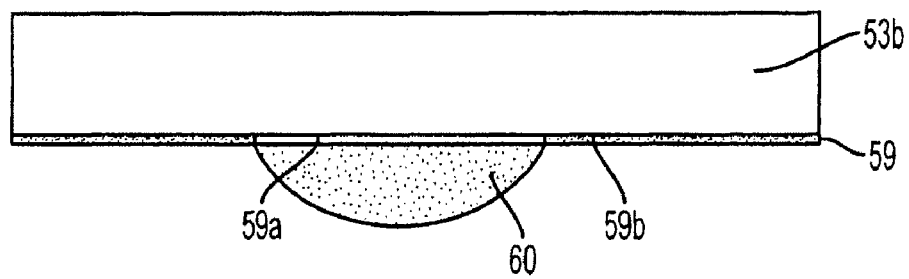
FIG. 13 shows a schematic side view of an image-side structure mount, corresponding to FIG. 12, but with a liquid droplet arranged on the radiation exit side.

FIG. 13 shows an alternative to the lens element 56a on the lower face of the structure mount 53a shown in FIG. 12. Specifically, FIG. 13 provides for a wetting layer 59 with a wetting subarea 59a and a non-wetting subarea 59b, which surrounds the subarea 59a, to be provided on the lower face, that is to say the radiation exit surface, of a corresponding structure mount 53b, and for a hanging liquid droplet 60 to be attached to the wetting layer area 59a. This droplet may, for example, be composed of water, in which case quartz glass, for example, is then suitable for the wetting layer area 59a.

The liquid droplet 60 acts as a liquid lens, and with this function replaces the wrung-on lens element 56a in the example in FIG. 12. The shape of the liquid droplet 60 and thus its optical imaging characteristics can be fixed in a desired manner by suitable material selection for the droplet 60, for the wetting layer area 59a, and for the non-wetting layer area 59b. Liquid lens systems of this type and of a different type which can be used in the present case and which may, for example, also be composed of a plurality of liquids are known per se from the prior art, to which reference can be made, and which thus require no further explanation. In operation, the saturation vapor pressure of the liquid which is used for the liquid droplet 60 is set in the space between the structure mount 53b and downstream optics by, for example, preventing any gas exchange between this intermediate space and the exterior or, when using water for the liquid droplet 60, by measuring the moisture content in the intermediate space, and by introducing water vapor, if required. In alternative embodiments, a plurality of such liquid droplets can also be provided on the lower face of the structure mount 59b.

The various embodiments which have been explained above with reference to FIGS. 12 and 13 for the image-side part of a measuring device are suitable not only, as mentioned, for OI devices but also, in a possibly suitably modified form, for measuring devices which are based on other measurement principles, for example on point diffraction interferometry.

As the exemplary embodiments shown and described above make plain, the invention makes available a device with the aid of which it is also possible to optically measure very accurately optical imaging systems having a very high numerical aperture, for example with the aid of wave front measurement by means of shearing interferometry or point diffraction interferometry. The device can be used, in particular, in the case of projection objectives in microlithography systems, such as those of the scanner or stepper type, as an OI arrangement for wavefront detection, or as a Moiré measuring arrangement, it being possible to integrate it into the lithography system itself, if necessary. It goes without saying that the measuring device according to the invention can also be used for the optical measurement of any other optical imaging systems with the use of interferometric or other conventional measurement techniques, in particular for spatially resolved measurement over the entire pupil area with a high numerical aperture.

By using immersion, for example for the formation of one or more immersion fluid chambers in one or more interspaces, traversed by the measuring optical radiation, between optical components of the measuring device and/or between the OUT and respectively adjacent test optics components, it is possible to reduce the aperture angle or the beam cross section of the measuring radiation, and the measuring device can be of compact design. Although the formation of immersion fluid chambers or the use of a container for the immersion fluid is generally advantageous, it is not mandatory. However, the invention also comprises embodiments in the case of which the immersion fluid is introduced without an immersion fluid chamber formed specifically therefor, and without a container provided specifically therefor. To be specific, the immersion fluid may be introduced adjacent to at least one of the one or more object-side and/or image-side test optics components, so that the guidance of the radiation through the immersion fluid is influenced in a desired way.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A projection optical system inspecting method that inspects the optical performance of a projection optical system used for immersion exposure, the method comprising:
   providing an optical member in an image plane side of the projection optical system;
   providing a detector;
   supplying a liquid to the image plane side of the projection optical system; and
   photoelectrically detecting a measuring beam that passes through the projection optical system, the liquid and the optical member with a CCD array.

2. A projection optical system inspecting method according to claim 1, wherein a flat part is disposed on the image plane side of the projection optical system and the liquid is supplied between the projection optical system and the flat part.

3. A projection optical system inspecting method according to claim 1, wherein the photoelectrically detecting comprises photoelectrically detecting the measuring beam that passes through the projection optical system, the liquid, and the optical member.

4. The projection optical system inspecting method according to claim 1, wherein the measuring beam is two dimensionally divided by the CCD array.

5. The projection optical system inspecting method according to claim 1, wherein the optical member is a diffraction grating.

6. The projection optical system inspecting method according to claim 5, wherein the diffraction grating is positioned at the image plane.

7. A projection optical system inspection apparatus that inspects the optical performance of a projection optical system used for immersion exposure, the projection optical system inspection apparatus comprising:
   a flat part disposed on an image plane side of the projection optical system; and
   a photoelectric detector that photoelectrically detects a measuring beam, the measuring beam passing through in order of the projection optical system, a liquid disposed between the projection optical system and the flat part, and the flat part, wherein the photoelectric detector is a CCD array.

8. A projection optical system inspection apparatus according to claim 7, wherein the wavefront aberration of the projection optical system is measured.

9. A projection optical system inspection apparatus according to claim 7, further comprising an optical system which is disposed between the flat part and the photoelectric detector.

10. An exposure apparatus according to claim 9, further comprising a stage including the projection optical system inspection apparatus.

11. An exposure apparatus comprising:
    a projection optical system; and
    the projection optical system inspection apparatus according to claim 7.

12. The projection optical system inspection apparatus of claim 7, wherein the measuring beam that passes through the flat part is two dimensionally divided by the CCD array.

13. The projection optical system apparatus of claim 7, wherein the flat part comprises a diffraction grating.

14. The projection optical system apparatus of claim 13, wherein the diffraction grating is positioned at the image plane.

* * * * *